United States Patent
Im

(10) Patent No.: US 8,476,144 B2
(45) Date of Patent: Jul. 2, 2013

(54) METHOD FOR PROVIDING A CONTINUOUS MOTION SEQUENTIAL LATERAL SOLIDIFICATION FOR REDUCING OR ELIMINATING ARTIFACTS IN EDGE REGIONS, AND A MASK FOR FACILITATING SUCH ARTIFACT REDUCTION/ELIMINATION

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 242 days.

(21) Appl. No.: 12/757,726

(22) Filed: Apr. 9, 2010

(65) Prior Publication Data

US 2010/0233888 A1  Sep. 16, 2010

Related U.S. Application Data

(60) Division of application No. 11/370,000, filed on Mar. 7, 2006, now Pat. No. 7,759,230, which is a continuation of application No. PCT/US2004/030324, filed on Sep. 16, 2004.

(60) Provisional application No. 60/503,409, filed on Sep. 16, 2003.

(51) Int. Cl.
    *H01L 27/00*  (2006.01)
(52) U.S. Cl.
    USPC .......................... 438/436; 438/438; 438/440
(58) Field of Classification Search
    USPC .......................... 438/436, 438, 440
    See application file for complete search history.

(56) References Cited

U.S. PATENT DOCUMENTS

| 3,632,205 A | 1/1972 | Marcy |
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |

(Continued)

FOREIGN PATENT DOCUMENTS

| DE | 19839718 | 3/2000 |
| DE | 10103670 | 8/2002 |

(Continued)

OTHER PUBLICATIONS

U.S. Appl. No. 60/253,256, filed Aug. 31, 2003, Im.

(Continued)

*Primary Examiner* — Howard Weiss
*Assistant Examiner* — Steven Rao
(74) *Attorney, Agent, or Firm* — Baker Botts LLP

(57) ABSTRACT

An arrangement, process and mask for implementing single-scan continuous motion sequential lateral solidification of a thin film provided on a sample such that artifacts formed at the edges of the beamlets irradiating the thin film are significantly reduced. According to this invention, the edge areas of the previously irradiated and resolidified areas which likely have artifacts provided therein are overlapped by the subsequent beamlets. In this manner, the edge areas of the previously resolidified irradiated areas and artifacts therein are completely melted throughout their thickness. At least the subsequent beamlets are shaped such that the grains of the previously irradiated and resolidified areas which border the edge areas melted by the subsequent beamlets grow into these resolidifying edges areas so as to substantially reduce or eliminate the artifacts.

8 Claims, 9 Drawing Sheets

U.S. PATENT DOCUMENTS

| | | | |
|---|---|---|---|
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bolzer et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Suguhara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,247,375 A | 9/1993 | Mochizuki et al. |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,534,716 A | 7/1996 | Takemura |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,643,801 A | 7/1997 | Ishihara et al. |
| 5,663,579 A | 9/1997 | Noguchi |
| 5,683,935 A | 11/1997 | Miyamato et al. |
| 5,696,388 A | 12/1997 | Funada et al. |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka |
| 5,948,291 A | 9/1999 | Neylan et al. |
| 5,960,323 A | 9/1999 | Wakita |
| 5,981,974 A | 11/1999 | Makita |
| 5,986,807 A | 11/1999 | Fork |
| 6,002,523 A | 12/1999 | Tanaka |
| 6,014,944 A | 1/2000 | Russell et al. |
| 6,020,224 A | 2/2000 | Shimogaichi et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 | 1/2001 | Aklufi et al. |
| 6,177,301 B1 | 1/2001 | Jung |
| 6,184,490 B1 | 2/2001 | Schweizer |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,286 B1 * | 12/2001 | Park et al. ............... 438/478 |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Farmiga et al. |
| 6,582,827 B1 | 6/2003 | Im |
| 6,590,228 B2 | 7/2003 | Voutsas et al. |
| 6,599,790 B1 | 7/2003 | Yamazaki et al. |
| 6,608,326 B1 | 8/2003 | Shinagawa et al. |
| 6,621,044 B2 | 9/2003 | Jain et al. |

| Patent | Date | Inventor |
|---|---|---|
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,744,069 B1 | 6/2004 | Yamazaki et al. |
| 6,746,942 B2 | 6/2004 | Sato et al. |
| 6,750,424 B2 | 6/2004 | Tanaka |
| 6,755,909 B2 | 6/2004 | Jung |
| 6,767,804 B2 | 7/2004 | Crowder |
| 6,770,545 B2 | 8/2004 | Yang |
| 6,777,276 B2 | 8/2004 | Crowder et al. |
| 6,784,455 B2 | 8/2004 | Maekawa et al. |
| 6,830,993 B1 | 12/2004 | Im et al. |
| 6,858,477 B2 | 2/2005 | Deane et al. |
| 6,861,328 B2 | 3/2005 | Hara et al. |
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 7,049,184 B2 | 5/2006 | Tanabe |
| 7,078,281 B2 | 7/2006 | Tanaka et al. |
| 7,091,411 B2 | 8/2006 | Falk et al. |
| 7,119,365 B2 | 10/2006 | Takafuji et al. |
| 7,144,793 B2 | 12/2006 | Gosain et al. |
| 7,164,152 B2 | 1/2007 | Im |
| 7,172,952 B2 | 2/2007 | Chung |
| 7,183,229 B2 | 2/2007 | Yamanaka |
| 7,187,016 B2 | 3/2007 | Arima |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,303,980 B2 | 12/2007 | Yamazaki et al. |
| 7,311,778 B2 | 12/2007 | Im et al. |
| 7,318,866 B2 | 1/2008 | Im |
| 7,319,056 B2 | 1/2008 | Im et al. |
| 7,326,876 B2 | 2/2008 | Jung |
| 7,341,928 B2 | 3/2008 | Im |
| 7,384,476 B2 | 6/2008 | You |
| 7,507,645 B2 | 3/2009 | You |
| 7,560,321 B2 | 7/2009 | Kato et al. |
| 7,645,337 B2 | 1/2010 | Im |
| 7,700,462 B2 | 4/2010 | Tanaka et al. |
| 7,804,647 B2 | 9/2010 | Mitani et al. |
| 2001/0001745 A1 | 5/2001 | Im et al. |
| 2001/0030292 A1 | 10/2001 | Brotherton |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0022471 A1 | 1/2003 | Taketomi et al. |
| 2003/0029212 A1 | 2/2003 | Im |
| 2003/0057418 A1 | 3/2003 | Asano |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0194613 A1 | 10/2003 | Voutsas et al. |
| 2003/0196589 A1 | 10/2003 | Mitani et al. |
| 2004/0040938 A1 | 3/2004 | Yamazaki et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im |
| 2005/0236908 A1 | 10/2005 | Rivin |
| 2006/0030164 A1 | 2/2006 | Im |
| 2006/0035478 A1 | 2/2006 | You |
| 2006/0040512 A1 | 2/2006 | Im |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im |
| 2007/0020942 A1 | 1/2007 | Im |
| 2007/0032096 A1 | 2/2007 | Im |
| 2007/0051302 A1 | 3/2007 | Gosian et al. |
| 2007/0108472 A1 | 5/2007 | Jeong et al. |
| 2007/0111349 A1 | 5/2007 | Im |
| 2007/0184638 A1 | 8/2007 | Kang et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0045181 A1 | 2/2009 | Im |
| 2009/0137105 A1 | 5/2009 | Im |
| 2009/0173948 A1 | 7/2009 | Im et al. |
| 2009/0189164 A1 | 7/2009 | Im et al. |
| 2009/0218577 A1 | 9/2009 | Im |
| 2009/0242805 A1 | 10/2009 | Im |
| 2009/0309104 A1 | 12/2009 | Im |
| 2010/0024865 A1 | 2/2010 | Shah et al. |
| 2010/0032586 A1 | 2/2010 | Im et al. |
| 2010/0065853 A1 | 3/2010 | Im |
| 2010/0099273 A1 | 4/2010 | Im |
| 2010/0197147 A1 | 8/2010 | Im |
| 2010/0233888 A1 | 9/2010 | Im |

FOREIGN PATENT DOCUMENTS

| | | |
|---|---|---|
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | S57-027035 | 2/1982 |
| JP | S62-160781 | 7/1987 |
| JP | 62181419 | 8/1987 |
| JP | S62-216320 | 9/1987 |
| JP | H01-256114 | 10/1989 |
| JP | H02-081422 | 3/1990 |
| JP | 02283036 | 11/1990 |
| JP | 04033327 | 2/1992 |
| JP | H04-167419 | 6/1992 |
| JP | 4279064 | 10/1992 |
| JP | H04-282869 | 10/1992 |
| JP | 5 041519 | 2/1993 |
| JP | H05-048190 | 2/1993 |
| JP | 06-011729 | 1/1994 |
| JP | 06252048 | 9/1994 |
| JP | H06-260502 | 9/1994 |
| JP | 06283422 | 10/1994 |
| JP | 07176757 | 7/1995 |

| | | |
|---|---|---|
| JP | H08-078330 | 3/1996 |
| JP | H09-007968 | 1/1997 |
| JP | 1997-171971 | 6/1997 |
| JP | 9260681 A | 10/1997 |
| JP | H09-270393 | 10/1997 |
| JP | 9321310 A | 12/1997 |
| JP | 10 189998 | 7/1998 |
| JP | H10-244390 | 9/1998 |
| JP | 11064883 | 3/1999 |
| JP | 11281997 | 10/1999 |
| JP | H11-297852 | 10/1999 |
| JP | 11330000 A | 11/1999 |
| JP | 2000-223425 | 8/2000 |
| JP | 2000-315652 | 11/2000 |
| JP | 2000-346618 | 12/2000 |
| JP | 2001023920 | 1/2001 |
| JP | 2002-203809 | 7/2002 |
| JP | 2002-353142 | 12/2002 |
| JP | 2002-353159 | 12/2002 |
| JP | 2003-031496 | 1/2003 |
| JP | 2003-100653 | 4/2003 |
| JP | 2003-523723 | 8/2003 |
| JP | 2004-031809 | 1/2004 |
| KR | 2000-0053428 | 8/2000 |
| TW | 464960 | 11/2001 |
| TW | 564465 | 12/2003 |
| TW | 569350 | 1/2004 |
| WO | WO 9745827 | 12/1997 |
| WO | WO 9824118 | 6/1998 |
| WO | WO 9931719 | 6/1999 |
| WO | WO 0014784 | 3/2000 |
| WO | WO 0118854 | 3/2001 |
| WO | WO 0118855 | 3/2001 |
| WO | WO 0171786 | 9/2001 |
| WO | WO0171791 | 9/2001 |
| WO | WO 0173769 | 10/2001 |
| WO | WO 0197266 | 12/2001 |
| WO | WO 0231869 | 4/2002 |
| WO | WO 0242847 | 5/2002 |
| WO | WO 0286954 | 5/2002 |
| WO | WO 02086955 | 10/2002 |
| WO | WO 03018882 | 3/2003 |
| WO | WO 03046965 | 6/2003 |
| WO | WO 03084688 | 10/2003 |
| WO | WO 2004017379 | 2/2004 |
| WO | WO 2004017380 | 2/2004 |
| WO | WO 2004017381 | 2/2004 |
| WO | WO 2004017382 | 2/2004 |
| WO | WO 2004030328 | 9/2004 |
| WO | WO 2004075263 | 9/2004 |
| WO | WO2005029546 | 3/2005 |
| WO | WO2005029548 | 3/2005 |
| WO | WO 2005029549 | 3/2005 |
| WO | WO2005029550 | 3/2005 |
| WO | WO2005029551 | 3/2005 |
| WO | WO 2006/055003 | 5/2006 |

OTHER PUBLICATIONS

Im et al., "Controlled Super-Lateral Growth of Si Films for Microstructural Manipulation and Optimization", Phys. Stat. Sol. (a), vol. 166, p. 603 (1998).
S.D. Brotherton et al., "Influence of Melt Depth in Laser Crystallized Poly-Si Thin Film Transistors," 82 J. Appl. Phys. 4086 (1997).
J.S. Im et al., "Crystalline Si Films for Integrated Active-Matrix Liquid-Crystals Displays," 21 MRS Bulletin 39 (1996).
Im et al., "Single-Crystal Si Films for Thin-Film Transistor Devices," Appl. Phys. Lett., vol. 70 (25), p. 3434 (1997).
Sposili et al., "Sequential Lateral Solidification of Thin Silicon Films on SiO2", Appl, Phys. Lett., vol. 69 (19), p. 2864 (1996).
Crowder et al., "Low-Temperature Single-Crystal Si TFT's Fabricated on Si Films processed via Sequential Lateral Solidification", IEEE Electron Device Letter, vol. 19 (8), p. 306 (1998).
Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.
C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.
J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.
H. Endert et al., "Excimer Laser: A New Tool for Precision Micromaching," 27 Optical and Quantum Electronics, 1319 (1995).
"Overview of Beam Delivery Systems for Excimer Lasers," Micro/Las Lasersystem GMBH. 1999.
K.H. Weiner et al., "Ultrashallow Junction Formation Using Projection Gas Immersion Laser Doping (PGILD)," A Verdant Technologies Technical Brief, Aug. 20, 1997.
Hau-Riege C.S. et al., "The Effects Microstructural Transitions at Width Transitions on interconnect reliabity," Journal of Applied Physics, Jun. 15, 2000, vol. 87, No. 12, pp. 8467-8472.
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, vol. 43, No. 10, Nov. 1983, pp. 946-948.
Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.
Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.
H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.
S.D. Brotherton, "Polycrystalline Silicon Thin Film Transistors," 10 Semicond. Sci. Tech., pp. 721-738 (1995).
H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).
E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).
Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).
Im et al., "Phase Transformation Mechanisms Involved in Excimer Laser Crystallization of Amorphous Silicon Films," Appl. Phys. Lett., vol. 63 (14), p. 1969 (1993).
Im et al., "On the Super Lateral Growth Phenomenon Observed in Excimer Laser-Induced Crystallization of Thin Si Films," Appl. Phys. Lett., vol. 64 (17), p. 2303 (1994).
Brochure from MicroLas Lasersystem, GmbH, "UV Optics Systems for Excimer Laser Based Micromaching and Marking". 1999.
Ishida et al., "Ultra-shallow boxlike profiles fabricated by pulsed ultraviolet-laser doping process", J. Vac. Sci. Technol. B 12(1), p. 399-403, 1994. (No month).
Yoshimoto, et al., "Excimer-Laser-Produced and Two-Dimensionally Position-Controlled Giant Si Grains on Organic SOG Underlayer", p. 285-286, AM-LCD 2000. No month.
Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.
I.W. Boyd, Laser Processing of Thin Films and Microstructures, Oxidation, Deposition, and Etching of Insulators (Springer—Verlag Berlin Heidelber 1987).
N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph.D. Dissertation Abstract, Columbia University, 1996.

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer—Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced by Scanned Laser Annealing in Al Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im, J.S., Method and system for producing crystalline thin films with a uniform crystalline orientation, U.S. Appl. No. 60/503,419.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3, 2005.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

van der Wilt, "The Commercialization of the SLS Technology," Taiwan FPD, Jun. 11, 2004, pp. 1-12.

Van Der Wilt, P.C., "State-of-the-Art Laser Crystallization of Si for Flat Panel Displays," PhAST, May 18, 2004, pp. 1-34.

Van Der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

Gosain et al., Formation of (100)-Textured Si Film Using an Excimer Laser on a Glass Substrate, Jpn. J. Appl. Phys., vol. 42 (2003) pp. L135-L137.

U.S. Appl. No. 11/370,000, filed Apr. 7, 2006.
U.S. Appl. No. 11/370,000; Mar. 2, 2009, Non-Final Rejection.
U.S. Appl. No. 11/370,000; Sep. 2, 2009, Response to Non-Final Rejection.
U.S. Appl. No. 11/370,000; Jan. 14, 2010, Notice of Allowance.
U.S. Appl. No. 13/273,687, filed Oct. 14, 2011.
U.S. Appl. No. 13/019,042, filed Feb. 1, 2011.
U.S. Appl. No. 11/373,772, Oct. 13, 2011 Response to Non-Final Office Action.
U.S. Appl. No. 11/373,772, Jul. 18, 2011 Non-Final Office Action.
U.S. Appl. No. 11/373,772, Aug. 24, 2010 Amendment and Request for Continued Examination (RCE).
U.S. Appl. No. 11/373,772, Jun. 11, 2010 Advisory Action.
U.S. Appl. No. 11/373,772, May 20, 2010 Response to Final Office Action.
U.S. Appl. No. 11/373,772, Feb. 24, 2010 Final Office Action.
U.S. Appl. No. 11/373,772, Oct. 26, 2009 Response to Non-Final Office Action.
U.S. Appl. No. 11/373,772, Jul. 27, 2009 Non-Final Office Action.
U.S. Appl. No. 11/372,161, Oct. 7, 2011 Amendment and Request for Continued Examination (RCE).
U.S. Appl. No. 11/372,161, Jul. 7, 2011 Final Office Action.
U.S. Appl. No. 11/372,161, Apr. 15, 2011 Response to Non-Final Office Action.
U.S. Appl. No. 11/372,161, Oct. 18, 2010 Non-Final Office Action.
U.S. Appl. No. 11/372,161, Mar. 8, 2010 Amendment and Request for Continued Examination (RCE).
U.S. Appl. No. 11/372,161, Jan. 26, 2010 Advisory Action.
U.S. Appl. No. 11/372,161, Jan. 7, 2010 Response to Final Office Action.
U.S. Appl. No. 11/372,161, Sep. 8, 2009 Final Office Action.
U.S. Appl. No. 11/372,161, Apr. 21, 2009 Response to Non-Final Office Action.
U.S. Appl. No. 11/372,161, Oct. 29, 2008 Non-Final Office Action.
U.S. Appl. No. 11/372,161, Aug. 11, 2008 Amendment and Request for Continued Examination (RCE).
U.S. Appl. No. 11/372,161, Apr. 11, 2008 Final Office Action.
U.S. Appl. No. 11/372,161, Jan. 18, 2008 Response to Non-Final Office Action.
U.S. Appl. No. 11/372,161, Jul. 20, 2007 Non-Final Office Action.
U.S. Appl. No. 12/402,208, Jun. 13, 2011 Amendment and Request for Continued Examination (RCE).
U.S. Appl. No. 12/402,208, Feb. 23, 2011 Final Office Action.
U.S. Appl. No. 12/402,208, Nov. 29, 2010 Response to Non-Final Office Action.
U.S. Appl. No. 12/402,208, Jun. 28, 2010 Non-Final Office Action.
U.S. Appl. No. 12/419,821, Sep. 2, 2011 Non-Final Office Action.
U.S. Appl. No. 12/419,821, Jun. 10, 2011 Response to Nn-Final Office Action.
U.S. Appl. No. 12/419,821, Mar. 22, 2011 Non-Final Office Action.
U.S. Appl. No. 12/567,414, Nov. 9, 2011 Non-Final Office Action.

Jeon et al., "New Excimer Laser Recrystallization of Poly-Si for Effective Grain Growth and Grain Boundary Arrangement," Jpn. J. Appl. Phys. vol. 39 (Apr. 2000) pp. 2012-2014.

Bergmann et al., "The future of crystalline silicon films on foreign substrates," Thin Solid Films 403-404 (2002) 162-169.

van der Wilt et al., "A hybrid approach for obtaining orientation-controlled single-crystal Si regions on glass substrates", Proc. of SPIE vol. 6106, 61060B-1-B-15, (2006) XP009151485.

Andra et al., "Multicrystalline LLC-SI Thin Film Solar Cells on Low Temperature Glass", *3rd World Conference on Photovoltaic Energy Conversion* May 11-18, 2003, Osaka, Japan, Poster, pp. 1174-1177 (2003).

Andra et al., "A new technology for crystalline silicon thin film solar cells on glass based on laser crystallization", *Photovoltiac Specialists Conference, Conference Record of the Twenty-Eight IEEE*, pp. 217-220 (2000).

Sinke et al., "Explosive crystallization of amorphous silicon: Triggering and propagation", *Applied Surface Science*, 43:128-135 (1989).

* cited by examiner

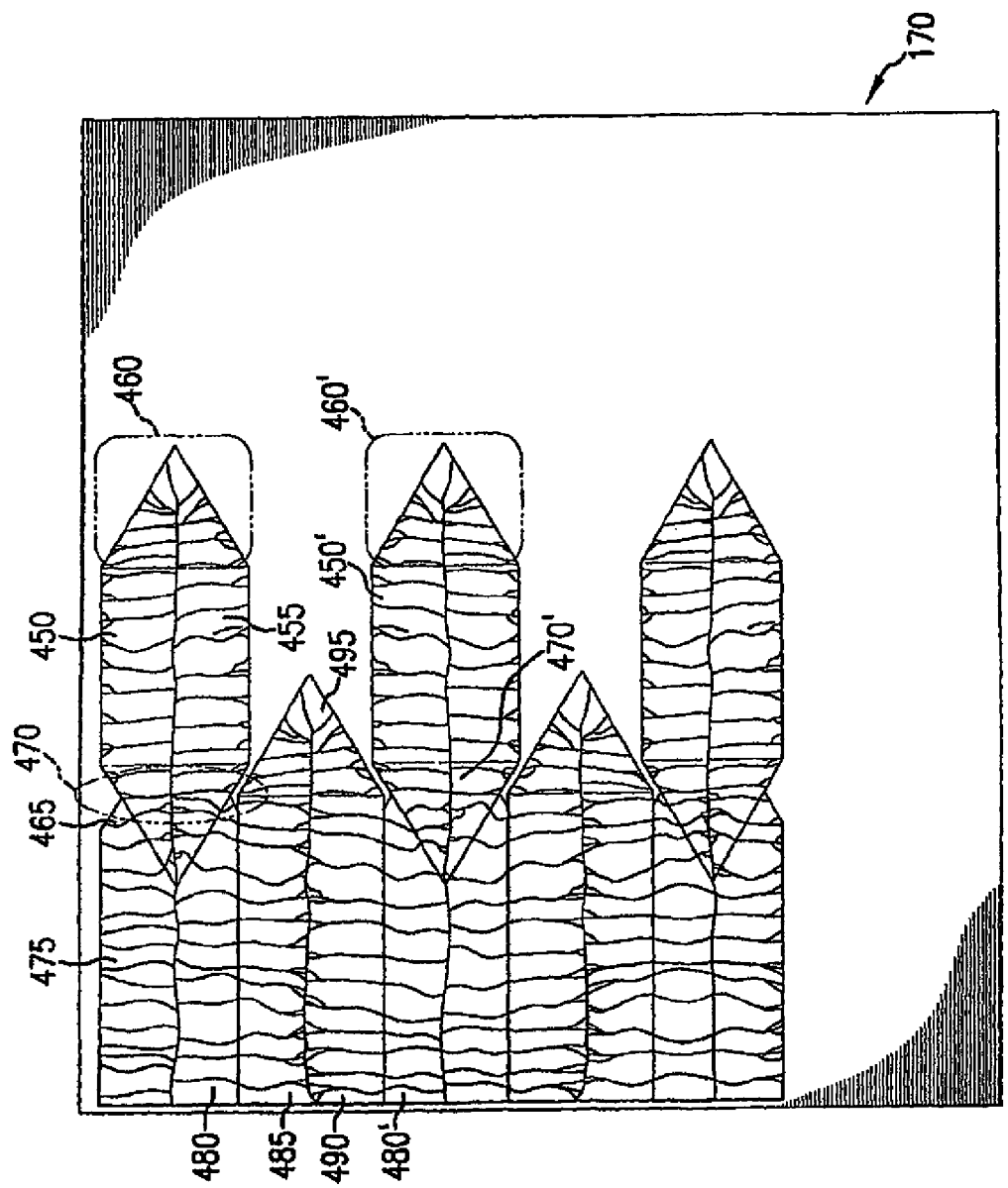

US 8,476,144 B2

METHOD FOR PROVIDING A CONTINUOUS MOTION SEQUENTIAL LATERAL SOLIDIFICATION FOR REDUCING OR ELIMINATING ARTIFACTS IN EDGE REGIONS, AND A MASK FOR FACILITATING SUCH ARTIFACT REDUCTION/ELIMINATION

CROSS-REFERENCE TO RELATED APPLICATIONS

This application is a divisional of U.S. patent application Ser. No. 11/370,000, filed Mar. 7, 2006, now U.S. Pat. No. 7,759,230 which is a continuation of International Application Ser. No. PCT/US04/030324, filed Sep. 16, 2004, published Mar. 31, 2005, which claims priority from U.S. Provisional application Ser. No. 60/503,409, filed Sep. 16, 2003, each of which are incorporated by reference in their entireties herein, and from which priority is claimed.

FIELD OF THE INVENTION

The present invention relates to a method, system and mask for processing a thin-film semiconductor material, and more particularly to forming large-grained, grain-shaped and grain-boundary-location controlled semiconductor thin films from amorphous or polycrystalline thin films on a substrate by continuous motion-scanning the entire sample or at least one portion thereof using a sequential lateral solidification technique so as to reduce or even eliminate artifacts, e.g., that may be formed in overlapped irradiated, melted and resolidifying regions of a sample or in the portion(s) thereof.

BACKGROUND INFORMATION

In the field of semiconductor processing, a number of techniques have been described to convert thin amorphous silicon films into polycrystalline films. For example, in James Im et al., "Crystalline Si Films for Integrated Active-Matrix Liquid-Crystal Displays," 11 MRS Bulletin 39 (1996), an overview of conventional excimer laser annealing technology is described. In such conventional system, an excimer laser beam is shaped into a beam having an elongated cross-section which is typically up to 30 cm long and 500 micrometers or greater in width. The shaped beam is stepped over a sample of amorphous silicon (i.e., by translating the sample) to facilitate melting thereof and to effectuate the formation of grain-shape and grain boundary-controlled polycrystalline silicon upon the re-solidification of the sample. Such techniques has been referred to as sequential lateral solidification ("SLS") of the melted portions of the sample to effectuate the growth of longer grain boundaries therein so as to achieve, e.g., uniformity among other thing.

Various techniques, processes, masks and samples have been previously described which utilize various SLS techniques, to effectively process the sample. For example, International Publication No. 02/086954 describes a method and system for providing a single-scan, continuous motion sequential lateral solidification of melted sections of the sample being irradiated by beam pulses. In this publication, an accelerated sequential lateral solidification of the polycrystalline thin film semiconductors provided on a simple and continuous motion translation of the semiconductor film are achieved, without the necessity of "microtranslating" the thin film, and re-irradiating the previously irradiated region in the direction which is the same as the direction of the initial irradiation of the thin film while the sample is being continuously translated.

One problem that may arise during SLS processing of a thin film provided on a sample is microstructural artifacts, e.g., grain misalignment. For example, these artifacts may be formed in the area of beamlet overlap. Such areas in which artifacts may form may be tail areas of the newest beamlet(s) irradiating the sample which overlap front or head areas of the previously irradiated and resolidified portion of the sample. These artifacts may arise because the edge of the beam (e.g., rounded or square-shaped), which is reproduced in the molten portion, leads to lateral growth of grains extending in from the edges at angles that are skewed to the desired direction of the lateral growth.

OBJECT AND SUMMARY OF THE INVENTION

An object of the present invention is to provide techniques for forming large-grained, grain-shaped and grain-boundary-location controlled polycrystalline thin film semiconductors using a sequential lateral solidification ("SLS") process, and to reduce or eliminate artifacts.

According to the present invention, an arrangement, process and mask are provided for implementing single-scan continuous motion sequential lateral solidification of a thin film situated on a sample such that artifacts are reduced or eliminated. For example, according to the present invention artifacts that may be formed at the edges of the beamlets irradiating the thin film are significantly reduced. According to this invention, the edge areas of the previously irradiated and resolidified areas which likely have artifacts provided therein are overlapped by the subsequent beamlets. In this manner, the edge areas of the previously resolidified irradiated areas and artifacts therein are completely melted throughout their thickness. At least the subsequent beamlets are shaped such that the grains of the previously irradiated and resolidified areas which border the edge areas melted by the subsequent beamlets grow into these resolidifying edges areas so as to substantially reduce or eliminate the artifacts.

In one exemplary embodiment of the present invention, an arrangement, process and mask can be provided for processing at least one portion of a thin film sample on a substrate. In particular, an irradiation beam generator can be controlled to emit successive irradiation beam pulses at a predetermined repetition rate. The exemplary mask may receive thereon each of the irradiation beam pulses. Such mask can include a beam pattern which, when the beam pulses irradiate therethrough, defines one or more first beamlets and one or more second beamlets, with each of the first and second beamlets having two opposite edge sections and a center section. The first beamlets can irradiate one or more first areas of the film sample so that the first areas are melted throughout their thickness.

At least one first section of the first areas irradiated by at least one particular beamlet of the first beamlets is allowed to re-solidify and crystallize thereby having grains grown therein. The first section includes at least one first resolidified area irradiated by the one of the edge sections of the particular beamlet, the first resolidified area including artifacts therein. After the one or more first areas are irradiated, the second beamlets irradiate one or more second areas of the film sample so that the second areas are melted throughout their thickness. At least one second section of the second areas irradiated by the subsequent beamlet is allowed to re-solidify and crystallize thereby having grains grown therein. The second section includes at least one second resolidified area irradiated by the at least one of the edge sections of the subsequent beamlet which overlaps the artifacts provided in the first resolidified area. In this manner, the artifacts can thus be substantially reduced or even eliminated upon the resolidification of the second section of the second area.

According to another exemplary embodiment of the present invention, the edge sections of each of the first and second beamlets are a front section and a rear section. The first resolidified area can be irradiated by the rear section of the particular beamlet, and the second resolidified area may be irradiated by the front section of the subsequent beamlet. The rear section of at least one particular beamlet has a width for a substantial length thereof which is smaller than a width of the center section of the particular beamlet. In addition, the front section of at least one subsequent beamlet of the second beamlets has a width for a substantial length thereof which is smaller than a width of the center section of the subsequent beamlet.

In yet another exemplary embodiment of the present invention, the rear section of the particular beamlet and the front section of the subsequent beamlet have substantially straight edges in which the straight edges slope toward one another and away from the center section of the respective one of the particular and subsequent beamlets. Also, the rear section of the particular beamlet and the front section of the subsequent beamlet can have a triangular shape. For example, each of the front and rear sections has three apexes, and one of the apexes of each of the front and rear sections points away from the central section of a respective one of the particular and subsequent beamlets. In yet another exemplary embodiment, the rear section of the particular beamlet and the front section of the subsequent beamlet have a trapezoid shape. Thus, the trapezoid-shaped rear section of the particular beamlet may have a first conceptual side extending for a width of the central section of the particular beamlet and a second side provided at an edge of the rear section away from the central section, with the first side being greater than the second side. The trapezoid-shaped front section of the subsequent beamlet can have a third conceptual side extending for a width of the central section of the subsequent beamlet, and a fourth side provided at an edge of the front section away from the central section. The third side is preferably greater than the fourth side. In another embodiment of the present invention, upon the resolidification of the second section of the second area, at least most of the grains from the resolidified first section of the first area that are adjacent to the second section grow into the solidifying second section in a direction which is approximately perpendicular to a direction of extension of the solidifying second section.

BRIEF DESCRIPTION OF THE DRAWINGS

Exemplary embodiments of the present invention will now be described in further detail with reference to the accompanying drawings in which:

FIG. 4C show an exemplary sequential stage of the SLS processing of the sample using the mask of FIG. 3A and the grain structures on the resolidified areas of the sample which shows the reduction or elimination of the microstructural artifacts provided in the areas where the previously-irradiated and resolidified areas have been overlapped by the newly irradiated and resolidified areas.

DETAILED DESCRIPTION

Figure 1:
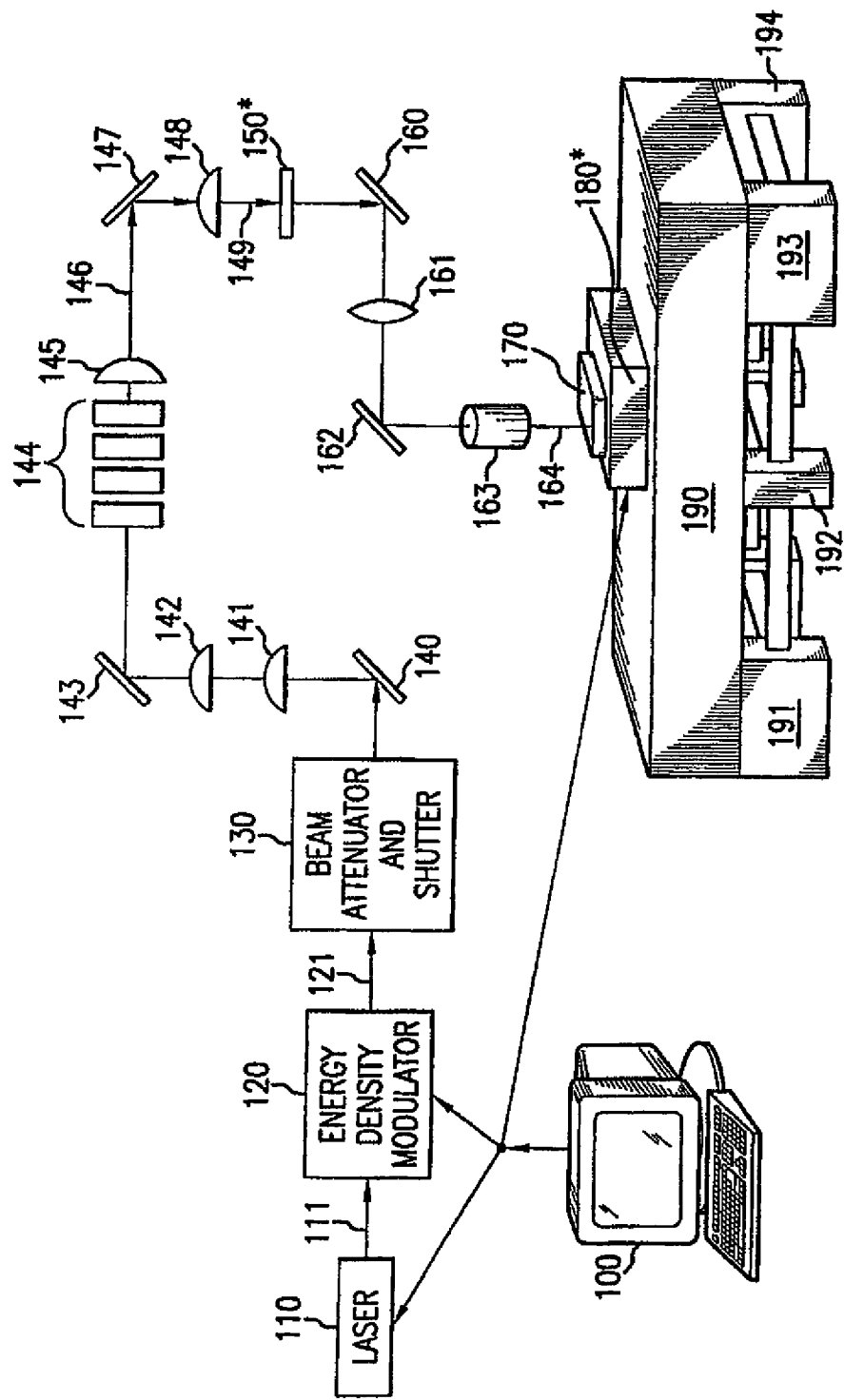
FIG. 1 shows a diagram of an exemplary embodiment of a system for performing a single-scan, continuous motion sequential lateral solidification ("SLS") according to the present invention which does not require a microtranslation of a sample for an effective large grain growth in a thin film, and effectuates a bi-directional grain growth within the irradiated and re-solidified area of the sample.

Certain systems and methods for providing a single scan, continuous motion SLS are described in International Publication No. 02/086954 (the "'954 Publication"), the entire disclosure of which is incorporated herein by reference. The '954 Publication explicitly describes and illustrates the details of these systems and methods, and their utilization of microtranslations of a sample, which may have an amorphous silicon thin film provided thereon that can be irradiated by irradiation beam pulses so as to promote the sequential lateral solidification on the thin film, without the need to microtranslate the sample and/or the beam relative to one another to obtain a desired length of the grains contained in the irradiated and re-solidified areas of the sample. Similar to the system described in the '954 Publication, an exemplary embodiment of a system for carrying out the continuous motion SLS processing of amorphous silicon thin films and reduce or eliminate microstructural artifacts according to the present invention is illustrated in FIG. 1. The exemplary system includes a Lambda Physik model LPX-315I XeCl pulsed excimer laser 110 emitting an irradiation beam (e.g., a laser beam), a controllable beam energy density modulator 120 for modifying the energy density of the laser beam, a MicroLas two plate variable attenuator 130, beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4x-6x eye piece 161, a controllable shutter 152, a multi-element objective lens 163 for focusing an incident radiation beam pulse 164 onto a sample 170 having a silicon thin film 52 to be SLS processed mounted on a sample translation stage 180, a granite block optical bench 190 supported on a vibration isolation and self-leveling system 191, 192, 193 and 194, and a computer 106 (e.g., a general purpose computer executing a program or a special-purpose computer) coupled to control the pulsed excimer laser 110, the beam energy density modulator 120, the variable attenuator 130, the shutter 152 and the sample translation stage 180.

The sample translation stage 180 may be controlled by the computer 106 to effectuate translations of the sample 40 in the planar X-Y directions and the Z direction. In this manner, the computer 106 controls the relative position of the sample 40 with respect to the irradiation beam pulse 164. The repetition and the energy density of the irradiation beam pulse 164 may also be controlled by the computer 106. It should be understood by those skilled in the art that instead of the pulsed excimer laser 110, the irradiation beam pulse can be generated by another known source of short energy pulses suitable for melting a semiconductor (or silicon) thin film. Such known source can be a pulsed solid state laser, a chopped continuous wave laser, a pulsed electron beam and a pulsed ion beam, etc. with appropriate modifications to the radiation beam path from the source 110 to the sample 170. In the exemplary embodiment of the system shown in FIG. 1, while the computer 106 controls translations of the sample 170 for carrying out the single-scan, continuous motion SLS processing of the thin film according to the present invention, the computer 100 may also be adapted to control the translations of the mask 150 and/or the excimer laser 110 mounted in an appropriate mask/laser beam translation stage (not shown for the simplicity of the depiction) to shift the intensity pattern of the irradiation beam pulses 164, with respect to the silicon thin film, along a controlled beam path. Another possible way to shift the intensity pattern of the irradiation beam pulse is to have the computer 100 control a beam steering mirror. The exemplary system of FIG. 1 may be used to carry out the single-scan, continuous motion SLS processing of the silicon thin film on the sample 170 in the manner using conventional masks, as well as those used according to the exemplary embodiments of the present invention. The details of such processing are set forth in further detail below.

An amorphous silicon thin film sample may be processed into a single or polycrystalline silicon thin film by generating a plurality of excimer laser pulses of a predetermined fluence, controllably modulating the fluence of the excimer laser pulses, homogenizing the intensity profile of the laser pulse plane, masking each homogenized laser pulses to define beamlets, irradiating the amorphous silicon thin film sample with the beamlets to effect melting of portions thereof that were irradiated by the beamlets, and controllably and continuously translating the sample 170 with respect to the patterned beamlets. The output of the beamlets is controllably modulated to thereby process the amorphous silicon thin film provided on the sample 170 into a single or grain-shape, grain-boundary-location controlled polycrystalline silicon thin film by the continuous motion sequential translation of the sample relative to the beamlets, and the irradiation of the sample by the beamlets of masked irradiation pulses of varying fluence at corresponding sequential locations thereon. One of the advantages of the system, method and mask according to the present invention is that the ability to reduce or eliminate the microstructural artifacts that may be formed on the areas on the sample in which edges (e.g., rear edges) of the newly irradiated and solidifying region of the sample 170 partially overlap edges (e.g., front edges) of the previously resolidified region of the sample 170.

Figure 2A:
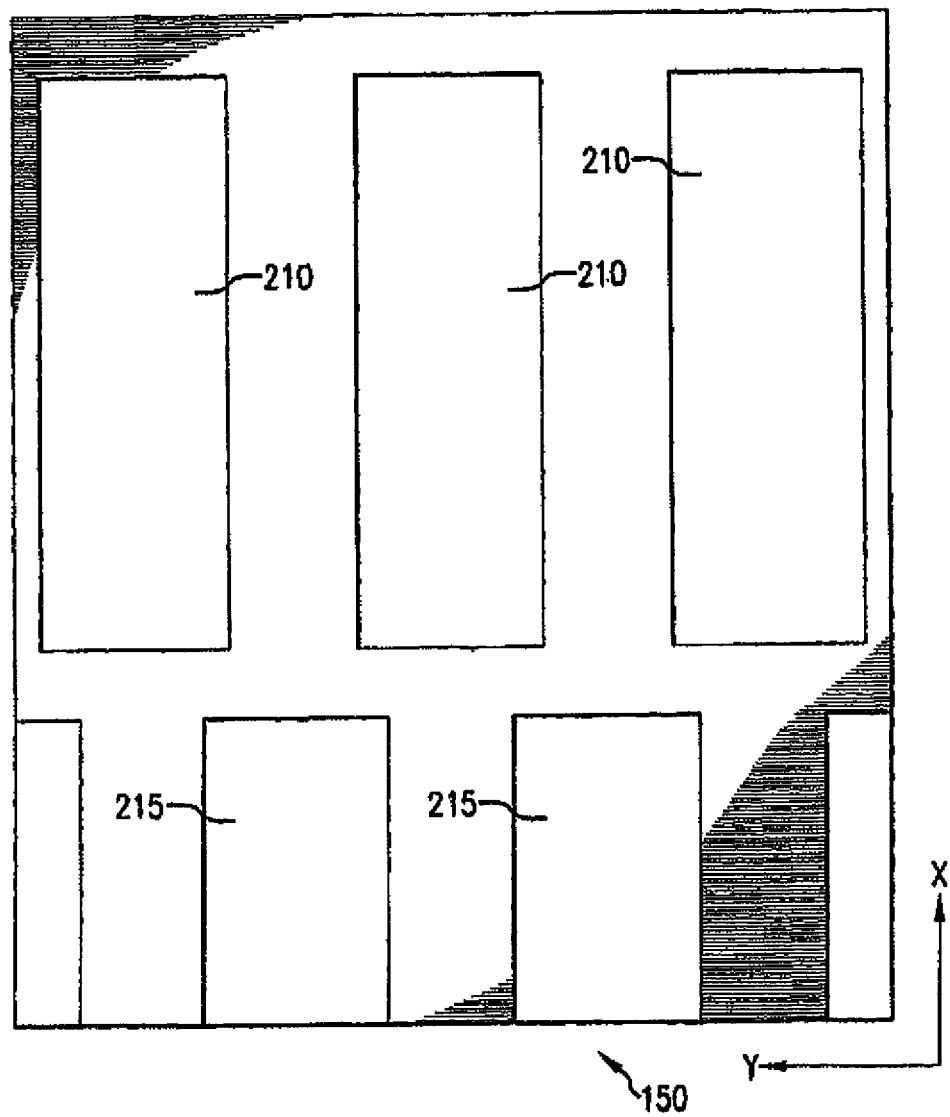
FIG. 2A shows an enlarged illustration of a first mask utilized by the conventional systems and methods having a rectangular shape, which facilitates the single-scan, continuous motion SLS as an intensity pattern generated thereby impinges the thin film on a substrate of the sample, and using which microstructural artifacts may possibly form.

FIG. 2A shows an enlarged illustration of a first mask 150 that has rectangular-shaped slits, as used in conventional continuous motion SLS-type systems and processes. These slits shape the beam being passed therethrough to produce an intensity pattern that impinges the thin film provided on the sample 170, and to be in a shape that is substantially the same as the shape of the corresponding slit. In particular, the slits of the mask 150 allow the respective portions of the beam 149 to irradiate therethrough, while other sections of the mask 150 are opaque, and do not allow the portions of the beam 149 to be transmitted through these opaque sections. This mask 150 includes a first set of rectangular-shaped slits 210 situated at an offset from one another along a negative Y-axis, and a second set of rectangular-shaped slits 215 are also provided at an offset from one another along a negative Y-axis, but also distanced from the first slits. The positioning of the first and second slits with respect to one another is shown and described in further detail in the '954 Publication.

Figure 2B:
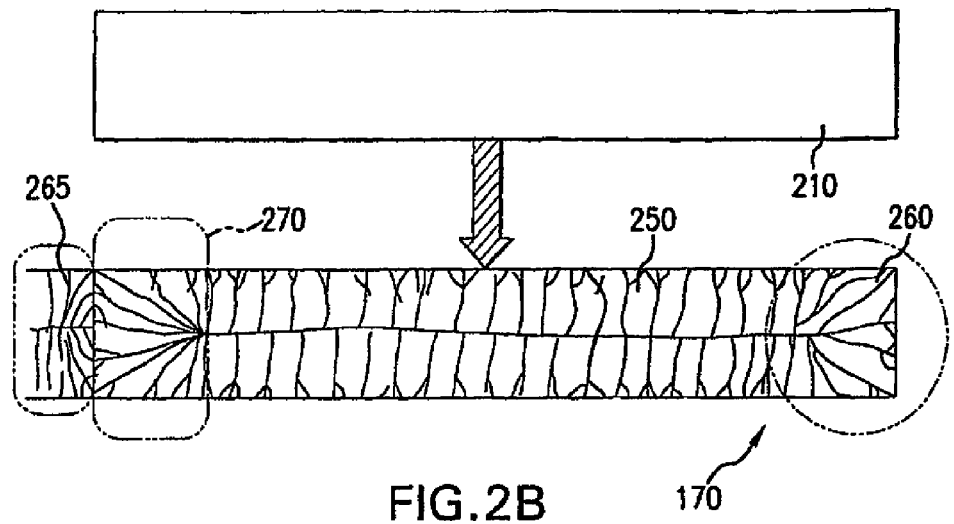
FIG. 2B shows an enlarged view of the resolidified region of the sample irradiated by one exemplary beamlet shaped by the mask of FIG. 2A which overlaps a portion of the previously resolidified region, as well as artifacts formed at the overlapped area.

FIG. 2B shows an exemplary illustration of the irradiation of the sample 170 by a sample beamlet of the intensity pattern shaped by the mask of FIG. 2A. In operation, this beamlet is irradiated on the sample so as to partially cover a portion (e.g., a front portion 265) of the previously irradiated, melted and resolidified area of the sample with its own portion (e.g., a tail portion 270). For example, the front portion 265 of the previously-resolidified area may have the grains grown in the orientation that is approximately parallel to the direction of the translation of the sample 170 and/or the beam pulse 164. Upon the irradiation of the next sequential region by the subsequent beamlet, a part of the front portion 265 is overlapped by the tail portion 270 of such beamlet, so as to completely melt, resolidify and form respective portions of the subsequent region 250, including a new front portion 260 and the tail portion 270. The grains of the front portion 265 of the previously resolidified region extend at angles that are contrary to the desirable direction of grain growth.

For example, the grains may extend approximately along the relative translation direction of the sample, which is unfavorable for processing the sample according to the continuous motion SLS-techniques. Such undesired grain growth is shown for the new front portion 260, which illustrates that that grains grow from the edges of the irradiated and fully melted region 250, such that at least some of the grains extend along the length of the region 250, thus potentially producing undesirable effects. On the other end, the undesirable grains that exist in the portion of the previously resolidified region 265 (extending approximately along the length of such region) grow into the tail portion 270 of the newly irradiated, melted and resolidifying region. Accordingly, the tail portion 270 of the resolidifying region 250 may have undesirably-oriented grains provided therein.

Figure 2C:
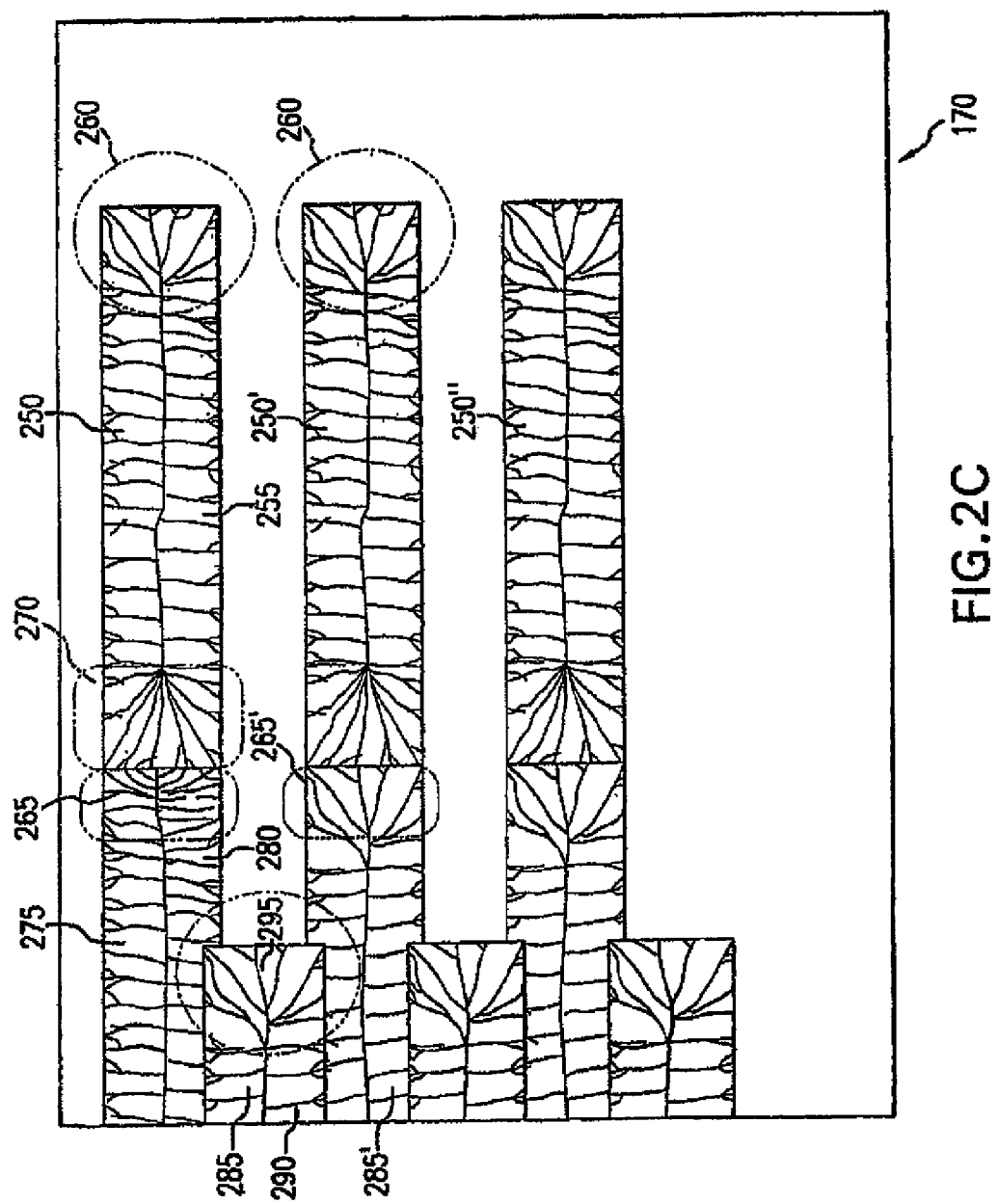
FIG. 2C show an exemplary sequential stage of the SLS processing of the sample using the mask of FIG. 2A and the grain structures on the resolidified areas of the sample which shows microstructural artifacts provided in the areas where the previously-irradiated and resolidified areas have been overlapped by the newly irradiated and resolidified areas.

FIG. 2C illustrates a section of the sample 170 which has been processed by one 610 two 620 and three 630 sequential intensity profiles produced by the mask of 150 of FIG. 2A.

The undesired grain growth described above with reference to FIG. 2B is shown herein. In addition, the previously solidified region 275 (which has the head portion 265 with the grains extending in an undesired manner) has a bottom region 280 with grains that extend into a top portion 285 of a further resolidifying region by seeding the resolidifying portions thereof with the grains of the bottom region 280. This further region is melted by the beamlet that is produced by the slits (215 and 210) of the mask 150 of FIG. 2B. Such further region also includes a respective front portion 295 in which undesired grains are grown as described above.

Figure 3B:
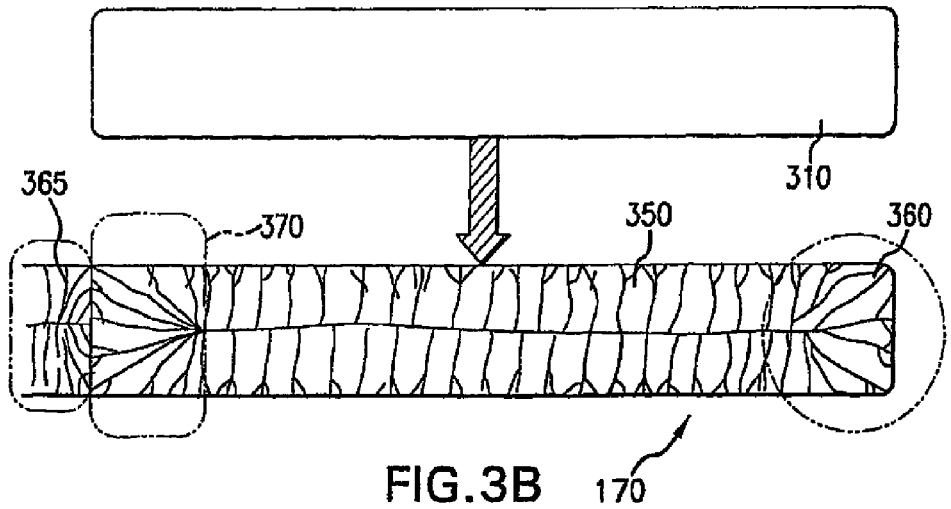
FIG. 3B shows an enlarged view of the resolidified region of the sample irradiated by one exemplary beamlet shaped by the mask of FIG. 3A which overlaps a portion of the previously resolidified region, as well as the illustration of the artifacts formed at the overlapped area.
Figure 3A:
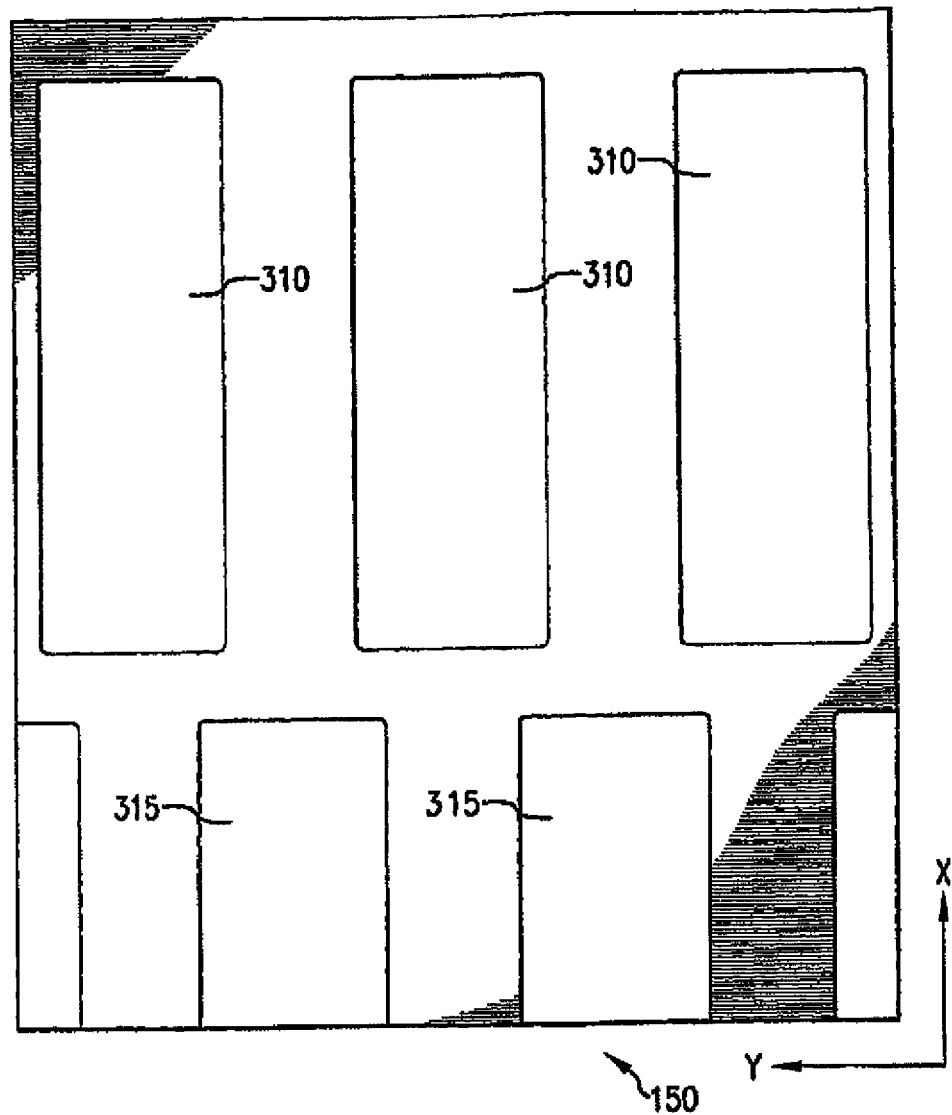
FIG. 3A shows an enlarged illustration of a second mask having a round or curved edges that may be utilized by the conventional systems and methods which facilitates the single-scan, continuous motion SLS, and using which microstructural artifacts may possibly form.

FIG. 3A shows an enlarged illustration of a second mask 150 that has slits with rounded edges, as used in conventional continuous motion SLS-type systems and processes. It is also possible for the edges to have a circular shape as well in this mask 150. This mask 150 includes a first set of round-edge slits 310 situated at an offset from one another along a negative Y-axis, and a second set of round-edge slits 315 are also provided at an offset from one another along a negative Y-axis, but also distanced from the first slits. The positioning of the first and second slits 310, 315 with respect to one another is substantially similar to that of the first and second slits 210, 215.

FIG. 3B shows an exemplary illustration of the irradiation of the sample 170 by a sample beamlet of the intensity pattern shaped by the mask 150 of FIG. 3A. In this illustration and similarly to the illustration of FIG. 2B, the front portion 365 of the previously-resolidified area may have the grains grown in the orientation that is approximately parallel to the direction of the translation of the sample 170 and/or the beam pulse 164, even though the edges of the resolidifying portions are curved or rounded. Indeed, the fact that the edges of the slits 310, 315 have such shape may promote the undesired grain growth along the direction of the relative translation of the sample 170. Again, a part of the front portion 365 of this previously resolidified is overlapped by the tail portion 270 of the newly melted and solidifying region 350, and such region 250 also includes a new front portion 260 and the tail portion 370. The grains of the front portion 365 of the previously resolidified region extend at angles that are contrary to the desirable direction of grain growth, and producing the microstructural artifacts in the overlapped portions.

Figure 4A:
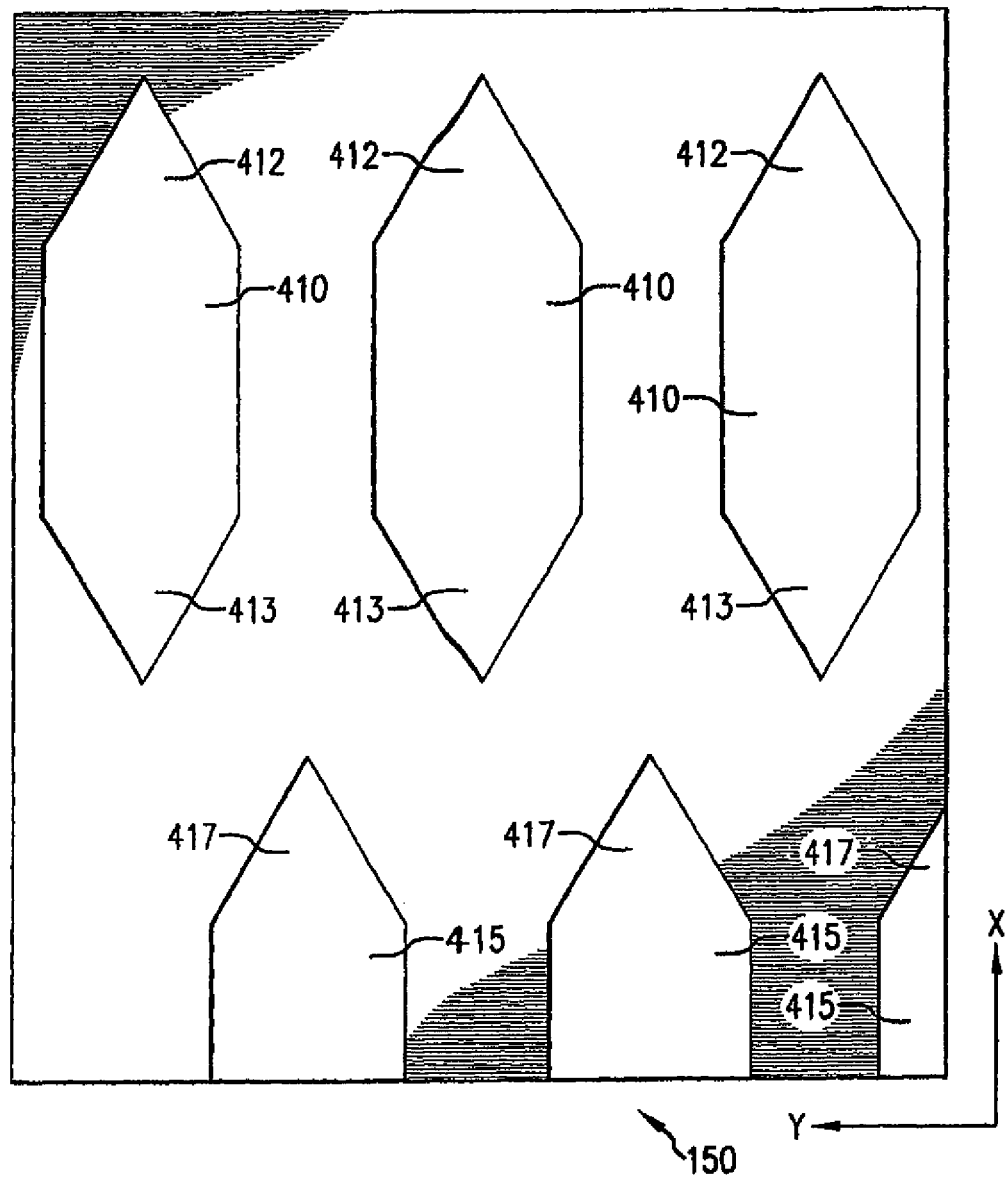
FIG. 4A shows an enlarged illustration of a first exemplary embodiment of the mask utilized by the system and method according to the present invention having a triangular shape at the edges thereof using which microstructural artifacts may be reduced or eliminated.

In order to reduce or eliminate artifacts, the exemplary mask, method and system according to the present invention are described herein. In particular, FIG. 4A shows an enlarged illustration of a first exemplary embodiment of the mask 150 according to the present invention which has slits with tapered areas on the ends thereof, that can be used with continuous motion SLS-type systems and processes according to the present invention. In this exemplary embodiment, both ends of each slit 412, 413 have triangular-shaped sections which point away from the respective slit. As described above with respect to the masks shown in FIGS. 2A and 2B, these slits shape the beam being passed therethrough to produce an intensity pattern that impinges the thin film provided on the sample 170, and to be in a shape that is substantially the same as the shape of the corresponding slit. The positioning of the first and second slits with respect to one another approximately similar to that of the first and second slits 210, 215.

Figure 4B:
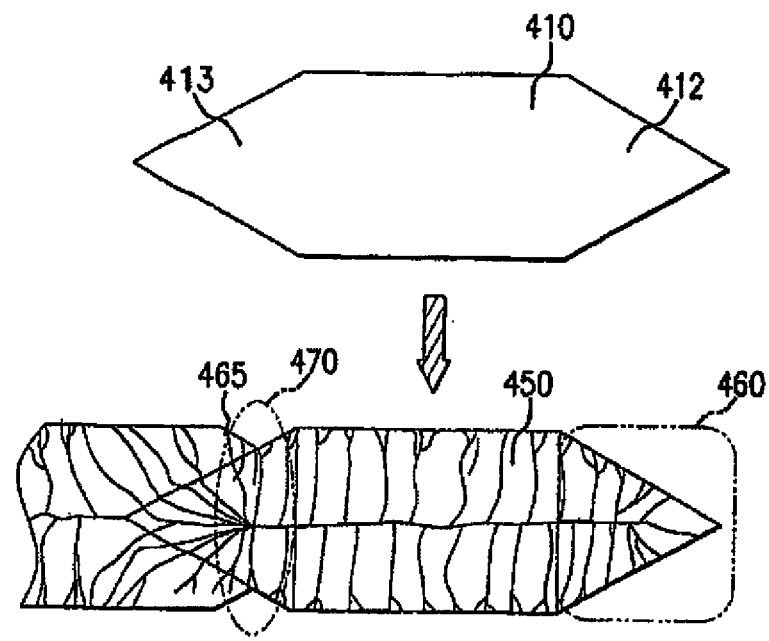
FIG. 4B shows an enlarged view of the resolidified region of the sample irradiated by one exemplary beamlet shaped by the mask of FIG. 4A which overlaps a portion of the previously resolidified region, and illustrates the reduction or elimination of the artifacts.

FIG. 4B shows an exemplary illustration of the irradiation of the sample 170 by a sample beamlet of the intensity pattern shaped by the mask of FIG. 2A. In operation, this beamlet is irradiated on the sample so as to partially cover a portion (e.g., a front portion 465) of the previously irradiated, melted and resolidified area of the sample with its own portion (e.g., a tail portion 470). The front portion 465 of the previously resolidified region is produced by a section of the beamlet that is shaped by a triangular portion 412 of the slit 410. The tail portion 470 of the newly melted and resolidifying region 450 is produced by another section of the beamlet that is shaped by the reverse-triangular portion 413 of the slit 410. For example, the front portion 465 of the previously-resolidified area may have very few grains grown in the orientation that is approximately parallel to the direction of the translation of the sample 170 and/or the beam pulse 164. Indeed, because the portion 465 has a tapered (e.g., triangular) shape as shown in FIG. 4B, most of the grains grown therein, upon its resolidification, would grow in the direction that is approximately perpendicular to the translation direction of the sample 170 and/or that of the beam pulse 164.

Upon the irradiation of the next sequential region by the subsequent beamlet, a part of the front portion 465 is overlapped by the tail portion 470 of such beamlet, so as to completely melt, resolidify and form respective portions of the subsequent region 450, including a new front portion 460 and the tail portion 470. Such overlap by the tail portion 470 of the region 450 melts at least the very end areas of the front portion 465 of the previously resolidified region. Indeed, these end areas may contain the undesired grains which undesirably grew in the direction of the translation of the sample and/or that of the beam pulse 164. Thus, the properly oriented grains of the front portion 465 would be the primary grains that seed the resolidifying tail portion 470 of the region 450. Therefore, the grains of the resolidifying portion 450 at the tail portion 470 thereof which overlaps the front portion 450 would be oriented in a desired manner (e.g., oriented perpendicularly to the direction of translation of the sample 170 and/or of the beam pulse 164). Indeed, as shown in FIG. 4B, such grain growth minimizes, and possibly eliminates the microstructural artifacts that may exist in the overlapped portions of the resolidified regions.

FIG. 4C illustrates a section of the sample 170 which has been processed by one 710 two 720 and three 730 sequential intensity profiles produced by the mask of 150 of FIG. 4A. The desired grain growth in the overlapped portions of the resolidified regions described above with reference to FIG. 4B is shown herein. In addition, the previously solidified region 475 (which has the head portion 465 with the grains extending in a desired manner) has a bottom region 480 with grains that extend into a top portion 485 of a further resolidifying region by seeding the resolidifying portions thereof with the grains of the bottom region 480. This further region is melted by the beamlet that is produced by slits (410 and 415) of the mask 150 of FIG. 4B. Such further region also includes a respective front portion 495 in which the undesired grains are grown as described above, Similarly to the description above with reference to FIG. 2C, there is a multiplicity of the regions 450 with the orientation of the grains in the overlapping areas. Thus, the exemplary mask, method and system according to the present invention provides for the reduction and/or removal of microstructural artifacts in the overlapping portions of the resolidified regions.

Figure 5B:
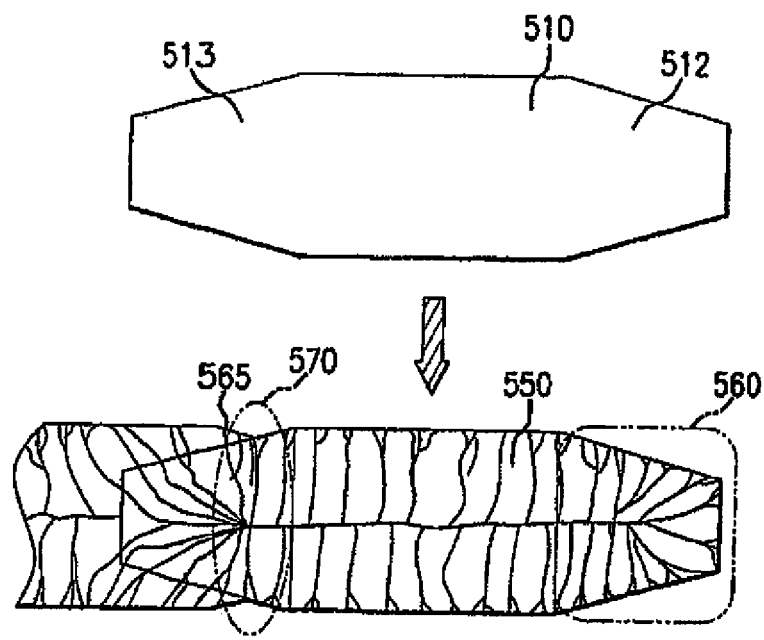
FIG. 5B shows an exemplary illustration of a sample irradiated by an exemplary beamlet shaped by the mask illustrated in FIG. 5A
Figure 5A:
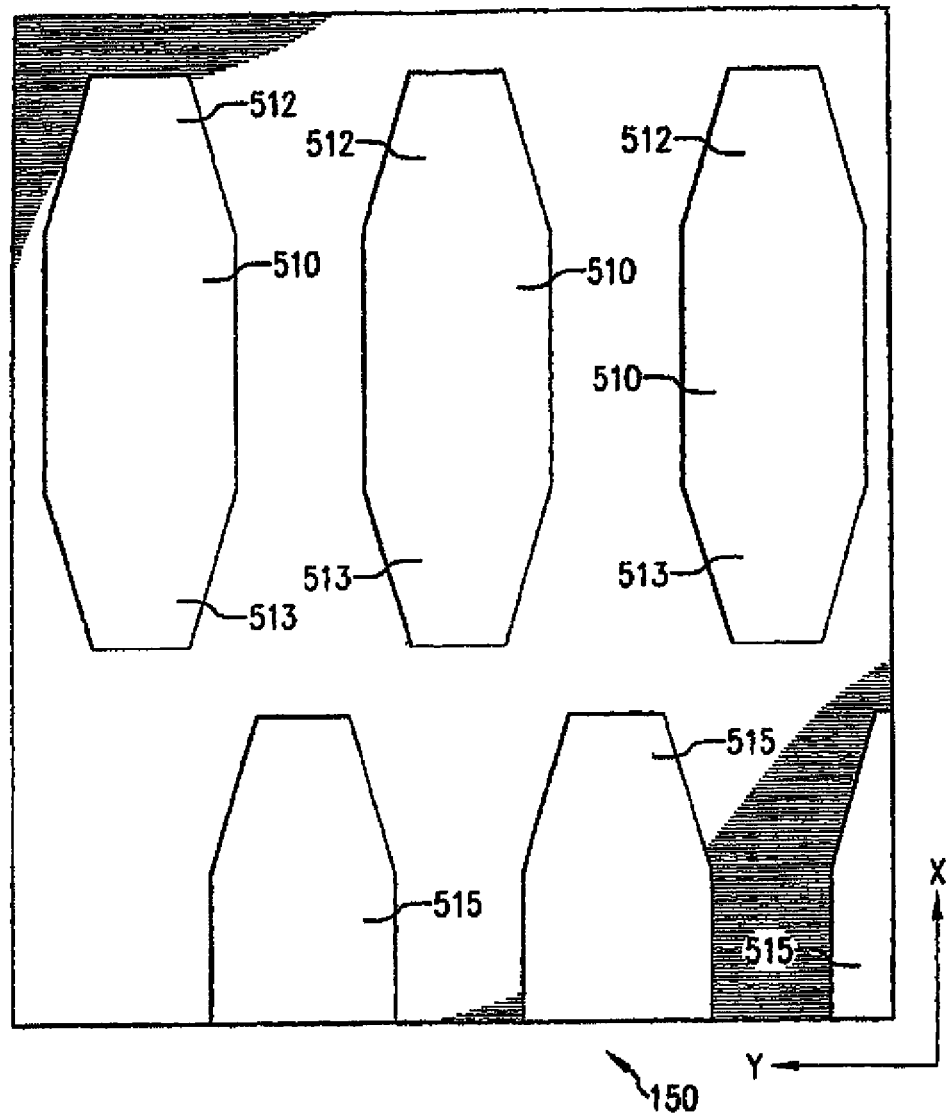
FIG. 5A shows an enlarged illustration of a second exemplary embodiment of the mask utilized by the system and method according to the present invention having a tapered shape at the edges thereof using which microstructural artifacts may be reduced or eliminated.

FIG. 5A shows an enlarged illustration of another exemplary embodiment of the mask 150 that has slits with tapered cut-off edges for use with the continuous motion SLS-type systems and processes according to the present invention. This mask 150 includes a first set of tapered cut-off slits 510 situated at an offset from one another along a negative Y-axis, and a second set of tapered cut-off slits 515 are also provided at an offset from one another along a negative Y-axis, but also distanced from the first slits. The positioning of the first and second slits 510, 515 with respect to one another is substantially similar to that of the first and second slits 410, 415.

FIG. 5B shows an exemplary illustration of the irradiation of the sample 170 by a sample beamlet of the intensity pattern shaped by the mask 150 of FIG. 5A. In this illustration and similarly to the illustration of FIG. 4B, the front portion 565 is produced by the section of the beamlet that is shaped by a tapered portion 512 of the slit 510. This front portion 565 of the previously-resolidified area may have the desirable grains grown in the orientation that is approximately perpendicular to the direction of the translation of the sample 170 and/or the beam pulse 164, and the rear portion 570 that overlaps at least a section of the front portion 565 is produced by the section of the beamlet that is shaped by a tapered portion 513 of the slit 510. This front portion 565 of the previously-resolidified area may have the desirable grains grown in the orientation that is approximately perpendicular to the direction of the translation of the sample 170 and/or the beam pulse 164. Similarly to the description provided above for sequential irradiation of the sample 170 by the mask of FIG. 4A, the sections of the tail portion 470 of the region 550 that may have any undesired grains therein are overlapped the front portion 465 of the previously resolidified region, and thus the properly oriented grains seed the melted tail portion 570 of the region 550 such that the grains are desirably grown in the direction that is perpendicular to the direction of the translation of the sample and/or that of the beam pulse 164. In this manner, any existent microstructural artifacts provided in the overlapped portions of the resolidified regions are reduced or even eliminated.

The foregoing exemplary embodiments merely illustrate the principles of the present invention. Various modifications and alterations to the described embodiments will be apparent to those skilled in the art in view of the teachings herein without departing from the scope of the invention, as defined by the appended claims.

The invention claimed is:

1. A process for processing at least one portion of a thin film sample on a substrate, the method comprising the steps of:
   (a) controlling an irradiation beam generator to emit successive irradiation beam pulses at a predetermined repetition rate;
   (b) masking each of the irradiation beam pulses to define one or more first beamlets and one or more second beamlets, each of the first and second beamlets having two opposite edge sections and a center section;
   (c) irradiating one or more first areas of the film sample by the first beamlets so that the first areas are melted throughout their thickness, wherein at least one first section of the first areas irradiated by at least one particular beamlet of the first beamlets is allowed to re-solidify and crystallize thereby having grains grown therein, the at least one first section including at least one first resolidified area;
   (d) after step (c), irradiating one or more second areas of the film sample by the second beamlets of the irradiation beam pulses so that the second areas are melted throughout their thickness, wherein at least one second section of the second areas irradiated by at least one subsequent beamlet is allowed to re-solidify and crystallize thereby having grains grown therein, the at least one second section including at least one second resolidified area irradiated by at least one of the edge sections of the subsequent beamlet which overlaps the at least one first resolidified area, wherein artifacts are substantially reduced and eliminated upon the resolidification of the at least one second section of the second area;
   wherein the edge sections of each of the first and second beamlets are a front section and a rear section, wherein the at least one first resolidified area is irradiated by the rear section of the particular beamlet, and wherein the at least one second resolidified area is irradiated by the front section of the subsequent beamlet, and
   wherein the rear section of at least one particular beamlet has a width for a substantial length thereof which is smaller than a width of the center section of the at least one particular beamlet, and wherein the front section of at least one subsequent beamlet of the second beamlets has a width for a substantial length thereof which is smaller than a width of the center section of the subsequent beamlet.

2. The process according to claim 1, wherein the rear section of the particular beamlet and the front section of the subsequent beamlet have substantially straight edges which slope toward one another and away from the center section of the respective one of the particular and subsequent beamlets.

3. The process according to claim 1, wherein the rear section of the particular beamlet and the front section of the subsequent beamlet have a triangular shape.

4. The process according to claim 3, wherein each of the front and rear sections has three apexes, and wherein one of the apexes of each of the front and rear sections points away from the central section of a respective one of the particular and subsequent beamlets.

5. The process according to claim 1, wherein the rear section of the particular beamlet and the front section of the subsequent beamlet have a trapezoid shape.

6. The process according to claim 5, wherein the trapezoid-shaped rear section of the particular beamlet has a first conceptual side extending for a width of the central section of the particular beamlet, and a second side provided at an edge of the rear section away from the central section, the first side being greater than the second side.

7. The process according to claim 5, wherein the trapezoid-shaped front section of the subsequent beamlet has a third conceptual side extending for a width of the central section of the subsequent beamlet, and a fourth side provided at an edge of the front section away from the central section, the third side being greater than the fourth side.

8. The process according to claim 1, wherein, upon the resolidification of the at least one second section of the second area, at least most of the grains from the at least one resolidified first section of the first area that are adjacent to the at least one second section grow into the at least one solidifying second section in a direction which is approximately perpendicular to a direction of extension of the at least one solidifying second section.

* * * * *